United States Patent [19]

Demuliere et al.

[11] 4,258,333

[45] Mar. 24, 1981

[54] FREQUENCY SYNTHESIZER HAVING A LOOP FILTER WITH A HIGH CUT-OFF FREQUENCY

[75] Inventors: Pierre Demuliere, Verrieres Le Buisson; Pierre Heins, Bois d'Arcy, both of France

[73] Assignee: U.S. Philips Corporation, New York, N.Y.

[21] Appl. No.: 44,728

[22] Filed: Jun. 1, 1979

[30] Foreign Application Priority Data

May 17, 1978 [FR] France .............................. 78 14547

[51] Int. Cl.³ .............................................. H03L 7/08
[52] U.S. Cl. ........................................ 331/11; 331/25
[58] Field of Search ..................... 331/1 A, 10, 11, 18, 331/25

[56] References Cited

U.S. PATENT DOCUMENTS 3,753,141  8/1973  Van Elk et al. .................. 331/10 X
3,806,826  4/1974  Schlosser ............................ 331/1 A
4,179,670  12/1973  Kingsbury ............................ 331/10

Primary Examiner—Siegfried H. Grimm
Assistant Examiner—Edward P. Westin
Attorney, Agent, or Firm—Thomas A. Briody; William J. Streeter; Edward W. Goodman

[57] ABSTRACT

This synthesizer comprises a phase-locked main loop, a frequency searching loop, a first digital loop for forming steps equal to the reference frequency F and a second digital loop for forming steps equal to the frequency F/Q, Q being an integer. According to the invention this synthesizer further comprises a third digital loop which acts on the setting of the steps having value F for forming the steps having a frequency F/R, R being an integer near Q. The elementary frequency step of the synthesizer has the frequency value |F/Q−F/R| or a value equal to a submultiple of the last-mentioned value. This spurious modulation at the frequency QR/|Q−R| F of the output signal of the phase comparator has an amplitude which is sufficiently low to make filtering unnecessary.

10 Claims, 7 Drawing Figures

FREQUENCY SYNTHESIZER HAVING A LOOP FILTER WITH A HIGH CUT-OFF FREQUENCY

BACKGROUND OF THE INVENTION

The invention relates to a frequency synthesizer comprising a phase-locked loop having, in this order, at least a voltage-controlled oscillator (VCO), a first divider having an adjustable division factor n or n+1, wherein n is an integer, a second divider, the division factor of which is a programmable integer M, a phase comparator and a low-pass filter, the output signal, of this second divider and a reference signal, having a frequency F, being applied to said phase comparator for generating an output signal which is applied as control voltage to the voltage-controlled oscillator via the low-pass filter. This frequency synthesizer further comprises a first digital loop having a first pulse counter which counts the input pulses of the second divider and which is reset to its initial counting position by each output pulse of this second divider, and a first comparison device to which the counting position of the said first counter and a digital numerical value u, which is adjustable by means of a first adjusting device, are applied for generating a control signal for controlling said first divider so that the size of the frequency steps is equal to the reference frequency F, as well as a second digital loop having a second pulse counter counting the output pulses of said second divider and a second comparison device to which the counting position of said second pulse counter and a digital numerical value, which is adjustable by means of a second adjusting device, are applied for generating a control signal for controlling the first divider, so that the size of the frequency steps is equal to z, wherein z is smaller than F namely so that F is a multiple of z in order to realize a division into decimal fractions.

Frequency synthesizers of this type are used in practice for forming an oscillator frequency which is adjustable in elementary frequency steps and the accuracy of which is provided by a reference frequency which is preferably derived from a crystal-controlled oscillator. In the further course of the description the reference character f denotes the frequency value of the elementary step, that is to say the smallest frequency step obtainable in different synthesizers, which will be described hereinafter.

A frequency synthesizer consists basically of a phase-locked loop which comprises a fixed programmable divider provided between the oscillator and the phase comparator (the divider having a division factor N). In that case the elementary step f is equal to the reference frequency F (f=F). In such a synthesizer the natural cutoff frequency $F_{cb}$ of the loop (in the absence of the low-pass filter) is defined by the formula $$f_{cb} = K\phi K_o G/N \quad (1)$$

where:
$K\phi$: slope of the phase comparator in volts/rad.
$K_o$: slope of the oscillator in MHz/volts
G: gain factor of the low-pass filter.
N: total division ratio between the output of the oscillator and the input of the phase comparator (for all synthesizers described in this description).

In such a synthesizer the oscillator output frequency can be increased or decreased by one single elementary step by simply increasing or decreasing the adjusted value of the programmable divider by one.

Frequencies ranging from, for example, 200 MHz to 400 MHz can be generated, by means of a synthesizer of this type, in 100 kHz steps due to the provision of a programmable divider which is programmable between 2000 and 4000. After integration, the output signal of the phase comparator must be free from unwanted noise components which have a negative effect on the loop. To this end the low-pass filter must be dimensioned so that spurious signals which accompany the generated frequency are attenuated so that they are lower than the natural noise of the oscillator. Particularly the following relation must be satisfied:

$$F_{cf} < F \quad (2)$$

On the other hand, in order to obtain a sufficiently rapid response of the loop, while the cutoff frequency of the low-pass filter, $F_{cf}$, should not be too low, it must in any case exceed the natural cutoff frequency of the loop $F_{cb}$ in the absence of the filter in order to maintain a proper loop stability. Consequently, the following relation must be satisfied:

$$F_{cb} < F_{cf} \quad (3)$$

Combining the relation (2) and (3) results in the relation $$F_{cb} < F_{cf} < F \quad (4)$$

Therefore, the low-pass filter must have a cutoff frequency $F_{cf}$ which satisfies the above-mentioned relation (4). In addition, the cut-off frequency of the filter must be as high as possible in order to ensure that the hold range of the control loop is sufficiently large. So, for the above-mentioned digital example, a cut-off frequency of $F_{cf} = 2$ kHz. In case one wishes to increase the number of elementary steps by making the step size as small as possible it is necessary for this type of synthesizer to reduce the value F of the reference frequency proportionally and to increase the number of adjustable steps of the divider proportionally. Should one, for example, want a synthesizer of this type for generating frequencies from 200 MHz to 400 MHz in 50 kHz steps, the fixed divider must then be programmable between 4000 and 8000 and the reference frequency must be equal to 50 kHz. This manner of reducing the elementary step size has some limitations, resulting from the fact that the cut-off frequencies $f_{cf}$ and $F_{cb}$ must of course also be lower, which entails the above-mentioned drawbacks. From the above-mentioned formulae (1) and (4) it will namely be apparent that in the second digital example chosen above, the cut-off frequency of the filter must be reduced by 50%, that is to say to approximately 1 kHz.

By means of the known technique of division into decimal-fractions, it is, however, possible to mitigate the above-mentioned drawbacks by the provision of a digital loop which, in accordance with a predetermined rhythm, automatically acts on the programming of the divider or on the number of input pulses of this divider, so that the elementary step having frequency f is equal to a fraction of the reference frequency F. In contrast to the preceding case, this causes a slight variation in the time interval between the output pulses of the programmable divider, which variation is experienced as an interference at the output of the phase comparator but the advantageous result of the operation is that, for comparable output performances, a divider is obtained which is programmable with a smaller number of adjustable steps and a loop filter having a higher cut-off frequency, which results in an improved loop response and, consequently, in a more rapid control.

Such a synthesizer is known from, for example, French Pat. No. 1,556,495. By means of a synthesizer of this type it is, for example, possible to obtain frequencies by means of an oscillator which is adjustable between 200 MHz and 400 MHz, these frequencies varying in 100 kHz steps due to the provision of a divider, the division factor of which can be programmed between 200 and 400 a reference frequency of 1 MHz and a filter having a cut-off frequency at approximately 200 kHz, a result of which is a factor of 10 better than in the case considered earlier in this description. Let it now be assumed that N' is the desired number of megahertz, N' is equal to the value N to which the divider has been adjusted and that k is the desired integral number of elementary steps of 100 kHz ($k \leq 9$). The second digital loop then acts in such a manner on the setting of the divider that in every 10 division cycles, that is to say after approximately 10 μs, the divider has divided k times by N+1 and 10−k times by N, resulting in a frequency of:

$$\frac{k(N + 1) + (10 - N)}{10} = N + \frac{k}{10} \text{ MHz} \quad (5)$$

The rhythm of the output pulse of the divider is equal to 1/10N+k, which results in a spurious signal having a frequency 100 kHz at the output of the phase comparator, which spurious frequency is located above the cut-off frequency of the filter, whereas the energy level of this spurious signal is sufficiently low to enable easy elimination by the filter. So this filter should have a cut-off frequency $F_{cf}$ which satisfies the relation:

$$F_{cf} < f \quad (6)$$

and, by combining the relations (3) and (6) it also satisfies the relation:

$$F_{cb} < F_{cf} < f \quad (7)$$

If an elementary step of 25 kHz is desired instead of a 100 kHz elementary step, in accordance with the technique of the decimal fraction principle, it is sufficient to include a modulo-40 counter in the digital loop instead of a modulo-10 counter. This would necessitate a considerable decrease of the cut-off frequency of the filter to below 25 kHz in order to enable the suppression of the spurious 25 kHz signal component to a sufficient extent, as is distinctly shown by formula (7).

An arrangement as described so far is suitable for frequency synthesis. Should it be desired to use such an arrangement as a phase or frequency modulator by, for example, varying the reference frequencies in the rhythm of the modulation, it appears that the maximum permissible rhythm of this modulation is limited to low values. Assuming the arrangement to operate with, for example, an elementary step of 25 kHz it then appears that the phase distortion produced in response to the modulation can only be kept within the permissible limits when the natural frequency of this modulation does not exceed the value of approximately $F_{cb}/3$, for example, 5 k bits per second.

SUMMARY OF THE INVENTION

It is an object of the invention to provide a synthesizer of the type described in the opening paragraph which, while maintaining its characteristic advantages such as a small elementary step and a large frequency range, can be provided with a loop filter, the cut-off frequency $F_{cf}$ of which is considerably higher than the natural cut-off frequency $F_{cb}$ of the loop, and, consequently, which enables, inter alia, a considerably higher modulation rhythm. According to the invention such a device therefore comprises a third digital loop for generating frequency steps having a size equal to y, wherein y is smaller than F, namely so that F is a multiple of y, this third digital loop including a third pulse counter (Modulo F/y) which counts the output pulses of the second divider, and a third comparator which compares the counting position a of said third counter with a digital numerical value r, which is adjustable by means of a third adjusting device, for generating an output signal which each time increases the numerical value u in the said first adjusting device by one unit for each counting position a which is smaller than or equal to the numerical value r.

The measures according to the invention are based on the recognition that the energy level of the spurious signal component present in the output signal of the phase comparator and having a frequency equal to the elementary step f can be reduced to a considerable extent and can even be lower than the natural noise of the oscillator if, instead of one frequency step, two frequency steps of a different size are used, the frequency value of each of these frequency steps being of necessity a sub-multiple of the reference frequency F and the difference, which is several times smaller than the frequency of each of these two frequency steps, being equal to the elementary frequency step f or a multiple of f.

An accurate investigation has shown that when the measures according to the invention are used, the output signal of the phase comparator, provided it is sufficiently linear, comprises only spurious signal components at the frequencies of the two frequency steps, but there is not any spurious signal component at the frequency of the elementary step f or a multiple thereof.

Consequently, a loop filter may, in principle, be dispensed with.

DESCRIPTION OF THE DRAWINGS

The invention and its advantages will now be further explained by way of example with reference to the accompanying drawings.

DESCRIPTION OF THE PREFERRED EMBODIMENT

Figure 1:
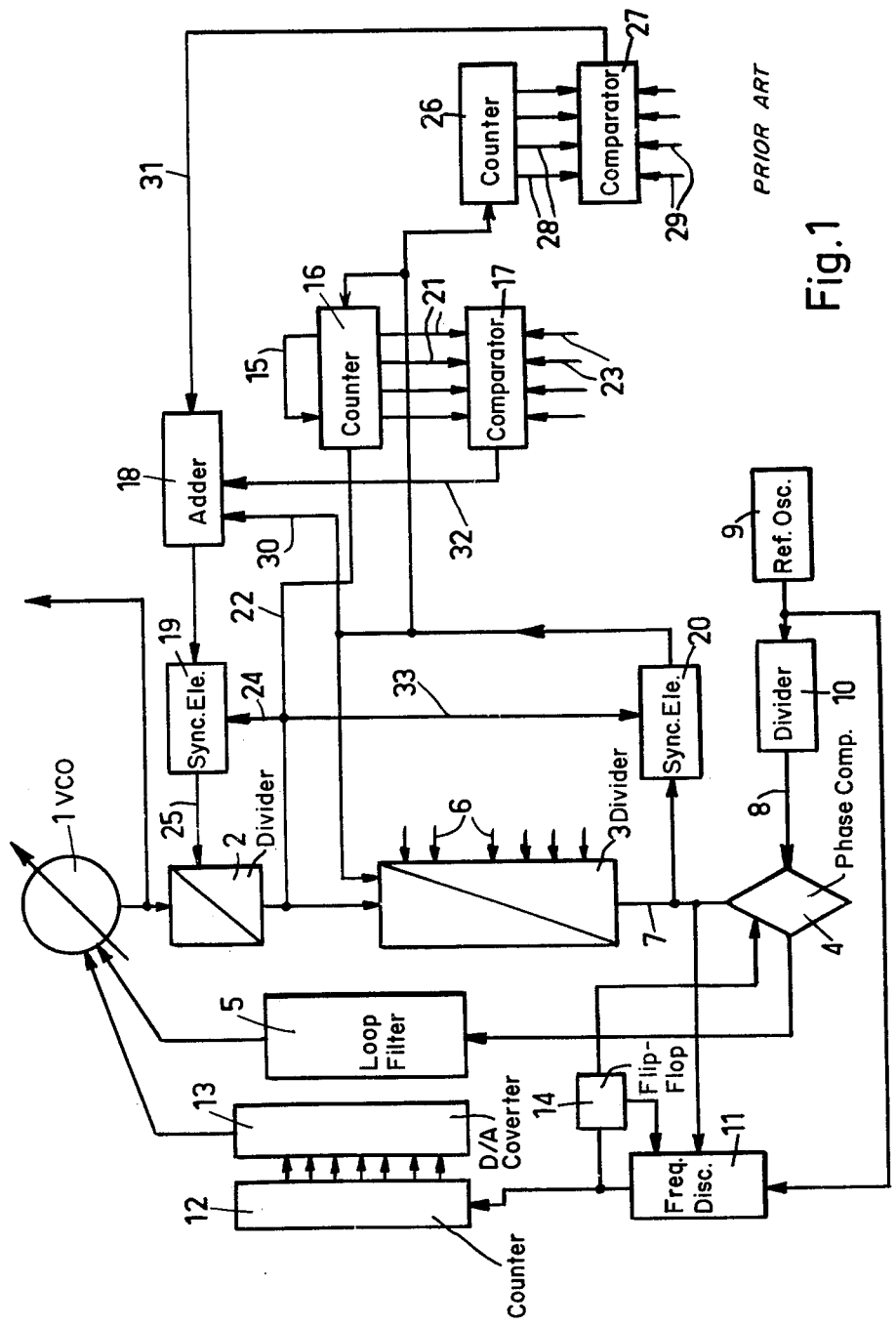
FIG. 1 shows by means of a block diagram a synthesizer which operates on the basis of the known technique of the decimal fraction principle.

The known synthesizer shown in FIG. 1 comprises a phase-locked main loop having, in this order, a voltage-controlled oscillator 1, a first divider 2, having an adjustable division factor n or n+1 (n=integer), a programmable second divider 3, a phase comparator 4 and a loop filter 5. The oscillator 1 symbolizes different VCO's (voltage-controlled oscillators), the frequency ranges of which partly overlap. In order to, for example, cover the range from 225 MHz to 400 MHz, the oscillator 1 consists of three VCO's, each covering 60 MHz, a switch from one VCO to the other being effected automatically by, for example, the means which are operated to adjust a certain desired frequency. The first divider 2 with adjustable division factor, n or n+1, divides by n in the absence of a control pulse at an input 25, and divides by n+1 in the presence of a control pulse at its input 25. The programmable (second) divider 3 divides the number of output pulses of the first divider by the integer M (M being, for example, between 22 and 30). The division factor M is defined starting from, for example, the binary value of each of its decimal figures, which are set in the divider 3 by means of double-throw switches 6. The phase comparator 4 compares the phase difference between the signal at the output 7 of the programmable divider 3 and a reference signal received by the phase comparator at a second input 8. This reference signal, having a frequency F is, for example, derived from a quartz oscillator 9 after having been divided by an integer P in a divider 10. The phase difference detected by the comparator 4 appears at the output of this comparator when the phase of the loop is locked by a logic signal of a variable width which, after integration, produces a d.c. voltage, the amplitude of which is proportional to the said phase difference. The filter 5 which closes the main loop is a low-pass filter which has for its function to eliminate the spurious signals present in the output signal of the phase comparator 4 these spurious signals being produced on the one hand by the phase comparator 4 and on the other hand by the use of the technique of the decimal fraction principle.

The arrangement shown in FIG. 1 further comprises a frequency searching loop. This search loop is provided between the output of the quartz oscillator 9 and a second input of the oscillator 1 and comprises, in this order, a frequency discriminator 11, a counter 12 and a digital-to-analog converter 13. The frequency discriminator 11 compares the output frequency of the oscillator 9 with the output frequency of the programmable divider 3; these frequencies must be in the ratio P:1 (P=division factor of the fixed divider 10), when phase-locking of the main loop has been obtained. As long as this frequency ratio has been obtained with an accuracy which corresponds to a predetermined frequency threshold, the discriminator 11 causes the counter 12 to count upwards by one unit, in response to which the output voltage at the output of the D/A converter 13 increases by a certain fixed voltage value. The output voltage of the D/A converter 13 controls the oscillator 1 step-by-step, the resultant discrete increase of the oscillator output frequency depending on the value of the calibrated voltage stage and on the slope $K_o$ of the control voltage versus the frequency characteristic of the oscillator. So the procedure may be that, each time the content of the counter 12 increases by one unit, the frequency of the oscillator 1 increased by one frequency step $\overline{PF}$, for example 2 MHz. The search loop operates cyclically and sequentially, the output of the counter 12 being fed back to its input, which, at the end of each counting cycle, enables cyclic scanning of the three oscillators 1 until the frequency range having the width $\overline{PF}$, which is the most suitable width for locking the phase, has been reached, whereafter phase locking is effected and the search loop as well as the main loop stabilize, while the content of the counter 12 does not change during the entire phase-lock period. In addition, a monostable flip-flop 14, which is controlled by each output pulse of the discriminator 11, is included between the output of the discriminator 11 and a third input of the phase comparator 4. A second output of the flip-flop 14 is connected to a third input of the discriminator 11. This flip-flop 14 has for its function to activate the search loop at each frequency step $\overline{PF}$ and thereafter the main loop by an additional delaying action on the phase comparator 4 and on the discriminator 11, until phase-locking has been achieved, all this to remove the risk of interferences in the control of the oscillator 1. Such interference would occur when the two loops are in simultaneous operation.

The known synthesizer as shown in FIG. 1 is a special embodiment of the division-into-decimal fractions principle, wherein the frequency divider, provided between the oscillator 1 and the phase comparator 4, is divided into two portions, namely the first divider 2 having a division factor adjustable to the value n or n+1) and the programmable second divider 3. The automatic change of the total division ratio N is only effected in response to the actuation of the first divider 2. If, for example, the first divider 2 is adjusted to the decimal counting mode, the hundreds and the tenths are adjusted in the programmable second divider 3 by means of the switches 6. The units are then formed by means of the first divider 2, which is a modulo-10/11 counter in this case. Unit is here understood to means a frequency step at the output of the oscillator 1 equal to the reference frequency F, that is to say, for example 100 kHz at a reference frequency of 100 kHz or, preferably, 1 MHz at a reference frequency of 1 MHz. The period 1/F of the signal at the reference frequency will be denoted "period" hereinafter, for example 1$\mu$ second at a reference frequency of 1 MHz. The units are formed by means of a first digital loop, which is connected between the output of the first divider 2 and a second input 25 of this first divider 2, the loop comprising the cascade arrangement of a first counter 16, a first comparator 17, an adder 18 and a first synchronizing element 19, a conductor 32 interconnects the elements 17 and 18. The first counter 16 has a capacity which is equal to or greater than 9 for a synthesizer working on a decimal basis. In the case in which the capacity of the first counter 16 exceeds 9, this first counter 16 is automatically reset to the initial counting position by means of a feedback, which is symbolized by the conductor 15, as soon as the first counter 16 reaches the value 9, in which position it remains blocked. The first counter 16 remains in this initial counting position until it receives at a first input a zero restarting pulse coming from the output of the second divider 3. This restarting pulse is formed in a suitable manner and is synchronized by a second synchronizing element 20, which is also used to set the programmable second divider 3 to zero. To this end the second synchronizing element 20 receives the output pulses of the first divider 2 at a second control input via the conductor 33 in such a manner that the leading edge of each of the output pulses of the second divider 3 coincides with a leading edge of the output pulses of the first divider 2, which also serves as clock generator for the synthesizer. The above-mentioned zero restarting pulse initiates the counting to 9 in the first counter 16, etc. The first counter 16 is connected to the first comparator 17 by means of switches 21 which have, for example, two switching positions, such as the switches 6, which automatically adjust the binary value of the number v, this number being representative of the counting content in the first counter 16. This number v, which varies between 0 and 9, increases by one for each pulse the first counter 16 receives via the conductor 22, which connects the output of the first divider 2 to the first input of the first counter 16.

A manually adjustable number u, which is desired in correspondence to the frequency to be generated, and which is adjusted by means of the switches 23, which are identical to the switches 6, is applied to the first comparator 17. For each value of v which is smaller or equal to u the first comparator 17 supplies a pulse, or preferably, a high direct voltage level, to the second input of the first divider 2 via the adder 18 and the first synchronizing element 19. The first synchronizing element 19 has for its function 19. The first synchronizing element 19 has for its function to apply each control pulse to the first divider 2 at the proper instant, that is to say at an instant immediately after the appearance of an output pulse of the first divider 2. To this end the output of this first divider 2 is connected via a conductor 24 to a second input of the first synchronizing element 19, the output of which is connected to the control input of the first divider 2 via the conductor 25. In other words, if during a period having the division factor n or n+1 of the divider 2, no control pulse has been received from the first comparator 17, the next division period will correspond to the period of time during which n (10) oscillator output pulses appear. If such a control pulse is received at any moment during this next dimision period, this control pulse remains stored in a register in the first synchronizing element 19 and is not transferred to the control input of the first divider 2, until after this period, namely as soon as the first synchronizing element 19 receives an output pulse of the first divider 2, the appearance of which coincides with the end of a dividing period having division factor 10. On receipt of the control pulse, the first divider 2 is switched to the division factor n+1 (11) in the subsequent dividing period, the duration of which will be equal to that of n+1 oscillator output pulses. The arrangement shown in FIG. 1 further comprises a second digital loop. This second digital loop is connected between the output 7 of the second divider 3 and the control input of the first divider 2 (conductor 25) and comprises the cascade arrangement of the second synchronizing element 20, a second counter 26, a second comparator 27, the adder 18 and the first synchronizing element 19, the outputs of the first and second comparators 17 and 27, respectively, being connected to the various inputs of the adder 18. The second counter 26 is a modulo-Q counter, for example modulo-10 or modulo-40. This second counter 26 is connected to the second comparator 27 by the switches 28 in the same manner as the first counter 16 is connected to the first comparator 17. The second comparator 27 compares the second counting content of the counter 26 to a manually adjustable binary numerical value w, which is applied to the other inputs of the second comparator 27 via the switch 29. The operation of the first counter 16 differs from the operation of the second counter 26 in that the content of the second counter 26 increases at a rate which is M times lower than the rate at which the content of the first counter 16 increases. In contradistinction to the discontinuous operation of the first counter 16, the second counter 26 operates continuously because this second counter 26 automatically resets itself to the zero position on reaching the maximum counting position. Assuming the period of the reference frequency F to be equal to $1\mu$ second, the above-mentioned difference in operation results in that during the first portion of each $1\ \mu sec$ period, u consecutive pulses, with a repetition frequency M MHz appear at the output of the first comparator 17 or, preferably, a direct voltage signal having the same duration as this sequence of pulses, whereas the second comparator 27 produces one output pulse for each $1\ \mu sec$ period which occurs during w periods. The repetition frequency of these output pulses being 1 MHz, this sequence of pulses or, preferably, this direct voltage signal repeats itself after a number of periods equal to the value Q of the modulo-Q counter 26. If, for example, the counter 26 is a modulo-10 counter and w is equal to 7, then each 10 $\mu secs$ a sequence of 7 pulses, each pulse having a period of 1 $\mu sec$, appears at the output conductor 31 of the second comparator 27, the duration of each sequence being equal to 7 $\mu sec$. If, for example, u is equal to 5, still on the assumption that the reference frequency is equal to 1 MHz, each $\mu sec$ a sequence of 5 pulses each pulse having a period of 1/M $\mu sec$, occurs at the output conductor 32 of the first comparator 17, the duration of each sequence being equal to 5/M $\mu sec$. So for a sequence of pulses on the conductor 32, there appear either one or zero pulses on the conductor 31. The adder 18 records all pulses which it receives via the conductors 31 and 32. More particularly, all pulses which are received during the duration of one period are stored in separate registers. The duration of the period is determined by the pulses applied via the conductor 30, which conductor 30 connects the output of the second synchronizing element 20 to a third input of the adder 18. At the end of each period, the pulse which is possibly applied via the conductor 31 is stored in a store in the adder 18, thereafter transferred in the order of priority of the first synchronizing element 19 at the instant $t_o$, thereafter, after a predetermined delay $\tau$, which is at a maximum equal to a period of the pulses appearing at the conductor 22, so at the instant $t_o + \tau$, the sequence of pulses coming the conductor 32 and stored in the adder 18 is, transferred in the same rhythm as the rhythm in which these pulses are applied to the adder 18 via the conductor 32. The frequency generated by the synthesizer shown in FIG. 1 is equal to $$\frac{w(N + u + 1) + (Q - w)(N + u)}{Q} = N + u + \frac{w}{Q}$$

in accordance with the known formula of the dimision-into-decimal fractions principle, the frequency of the elementary step being equal to 1/Q times the frequency of the reference frequency F, so F/Q=z (for the case shown in FIG. 1, z=f). The control pulses for controlling the division by division factor n+1 in the first divider 2 are received from the comparator 27 and serve to form the elementary steps which are Q times smaller than the unit. Due to the fact that these control pulses appear at irregular instants, they introduce a spurious modulation $\Delta F'$ having a frequency equal to the frequency of the elementary step, F/Q. This unwanted frequency which is present in the output signal of the phase comparator 4 is suppressed by the filter 5. To this end the filter 5 must have a cut-off frequency which is considerably lower than F/Q. On the other hand the condition $F_{cb} < F_{cf}$ (see the above relation (3)) must be satisfied. Let it be assumed that:

F = 1 MHz
$K\phi$ = 1 volt/rad.
$K_o$ = 6 MHz/volt
G = 1 and that frequencies between 200 MHz and 400 MHz must be generated (wherein N varies between 200 and 400).

In accordance with the formula (1) then:

$$F_{cb} = k\phi k_o g/N$$

For an average division ratio of 300 this results in:

$$F_{cb} = 20 \text{ kHz}$$

these data corresponding to an increase in the frequency of the oscillator 1 by 2 MHz, as described above ($\overline{PF} = 2MHz$).

From this it follows that to form frequencies having elementary steps of 100 kHz, the loop filter 5 must be a low-pass filter having a cut-off frequency $F_{cf}$ of between 20 kHz and 100 kHz in order to satisfy the two above-mentioned conditions expressed by the relation (7).

If, on the contrary, one wants to obtain an elementary step having a frequency f = z = 25 kHz with the synthesizer of FIG. 1 this can be achieved by constructing the counter 26 as a modulo-40 counter. The spurious signal to be suppressed by the low-pass filter 5 is then located at 25 kHz, which necessitates that the filter cut-off frequency $F_{cf}$ and, consequently, the frequency $F_{cb}$ must be below 25 kHz. In these circumstances the filter 5 is difficult to produce. It must comprise phase correcting networks so that the phase margin near the frequency $F_{cb}$ remains sufficient (Nyquist stability criterium) and must yet be capable of attenuating the level of the spectrum components at 25 kHz to a level of approximately −80 dB with respect to the oscillator output signal level.

Figure 2:
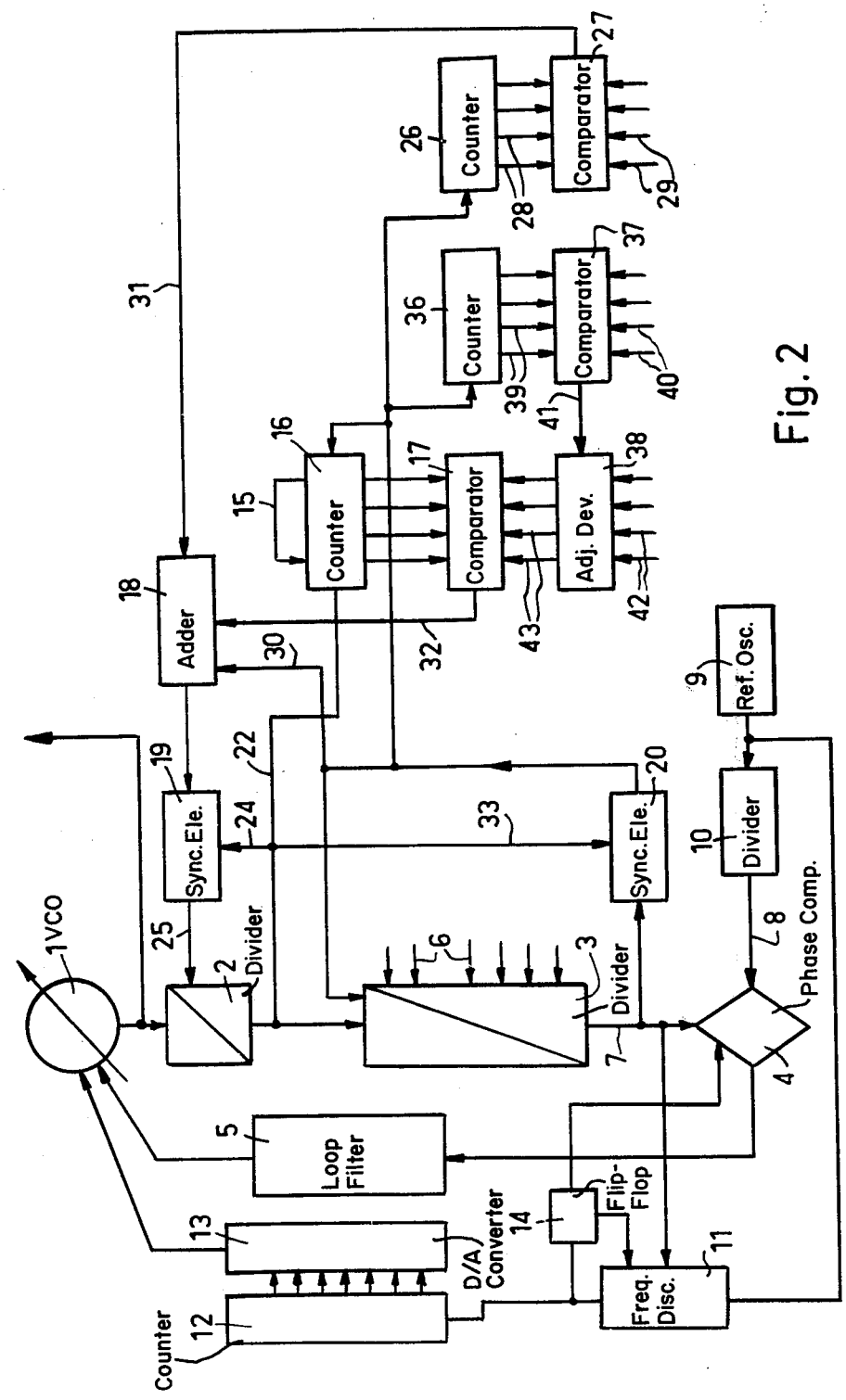
FIG. 2 shows by means of a block diagram a possible embodiment of the synthesizer according to the invention.

According to the invention the above-mentioned drawback is mitigated to a very great extent by adding a third digital loop to the synthesizer described so far. FIG. 2 shows such a synthesizer. Components corresponding to those in FIG. 1 are given the same reference numerals in FIG. 1. The third digital loop comprises, between the output conductor 7 of the second divider 3 and the control input of the first divider 2 (conductor 25), the cascade arrangement of the second synchronizing element 20, a third pulse counter 36, a third comparator 37, a modified first adjusting device 38, the first comparator 17, the adder 18 and the first synchronizing element 19. The third counter 36 is a modulo-R counter, the operation of which is the same as that of the second counter 26, the counters 26 and 36 counting the same pulses. The third comparator 37 operates in the same manner as the comparator 27. Via the switches 39, this third comparator 37 receives the binary numerical value present in the counter 36, and on the other hand the adjustable binary numerical value r by means of the switches 40. A conductor 41 connects the output of the comparator 37 to the first adjusting device 38. The binary numerical value u, which is supplied by the first adjusting device 38, is adjustable by means of switches 42 and is increased by one unit each time this first adjusting device 38 receives a pulse via the conductor 41. The pulses at 41 follow one another sequentially (or in direct voltage steps having a duration equal to that of the above-mentioned sequences), the time interval between the begining of sequences of pulses being R periods and the duration of each sequence being equal to r µs (r periods). The operation of the first counter 16 and the operation of the third comparator 37 are so related time that the pulse (or direct voltage step) possibly appearing during a given period on the lead 41, occurs during that portion of the period wherein the first counter 16 is blocked. During this portion of the period the binary numerical value u, set in the device 38, is increased by one and this new value u + 1 is transferred to the first comparator 17 by means of the switches 43. This operation has for its result that in the next period the control pulse, which is applied to the first divider 2 for setting the division factor n + 1, which control pulse is generated by the formation of the frequency step F/F = y and which is transferred via the lead 41, participates as the last pulse of the sequency which appears on the conductor 32, this sequence of pulses then comprising u + 1 pulses for the considered periods. It should be noted that the minimum number of different counting positions of the counter 16 is necessity one higher than for the case of FIG. 1, so, for example, 10 instead of 9. As was also the case when forming the frequency steps F/Q, also the formation of the frequency steps F/R results in the occurrence of a (third) spurious modulation $\Delta''$, due to the repetition frequency R/F of the sequences of pulses on the lead 41 and, consequently, also at the output of the first synchronizing element 19. The filter 5 must also suppress this spurious signal $\Delta F''$. It should be noted that in the above described operation of the synthesizer shown in FIG. 2, these spurious signals $\Delta F''$ and $\Delta F'$ do not affect one another and that the configurations of pulses for controlling the division factor adjustment n + 1 with respect to $\Delta F'$, are the same in the time in the case of FIG. 1 as well as in the case of FIG. 2. At a proper choice of Q and R, it is possible to form the frequency steps F/Q and F/R so that the elementary frequency step, that is to say the smallest step obtainable by means of the synthesizer of FIG. 2 is equal to |F/Q − F/R| or to a third-multiple of this value, where $$|F/Q - F/R| < F/R \text{ and}$$

$$|F/Q - F/R| < F/Q.$$

In particular, f may be equal to the highest common factor of the numbers y and z.

According to a preferred embodiment for the formation of the elementary frequency step of 25 kHz in a synthesizer shown in FIG. 2, comprising a reference signal having frequency f = 1 MHz, a second divider 3 having division factor M, M varying between 20 and 40, and a first divider (which is adjustable to division factor 10 or 11), the counters 26 and 36, respectively, are formed by a modulo-8 counter (frequency steps of 125 kHz) and a modulo-10 counter, frequency steps of 100 kHz), or the counter 26 may be a modulo-10 counter and the counter 36 a modulo-8 counter. The line spectrum of the output signal of the phase comparator 4 for different values of r and w is shown in the FIGS. 3a, 3b and 3c, the abscissa being linearly graduated in frequencies and the ordinates logarithmically in attenuation values.

Figure 3A:
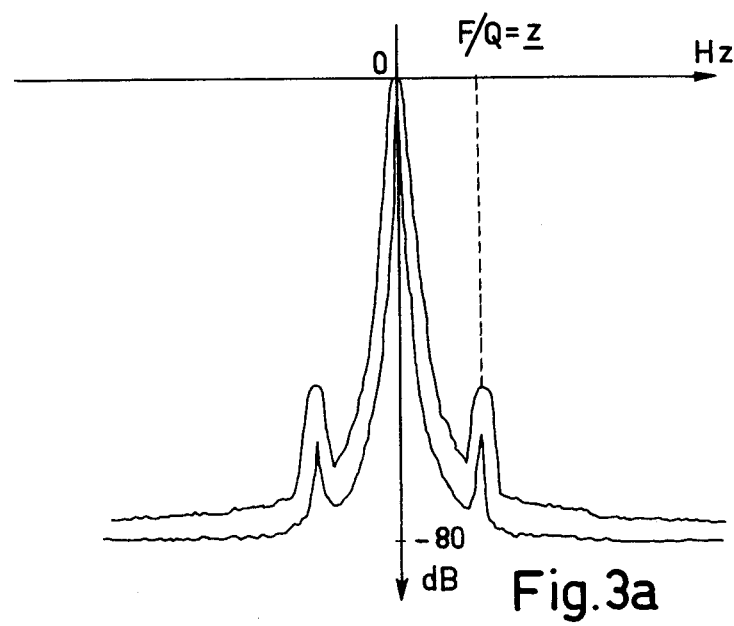
FIGS. 3a, 3b, 3c are an illustration of the frequency spectra.
Figure 3B:
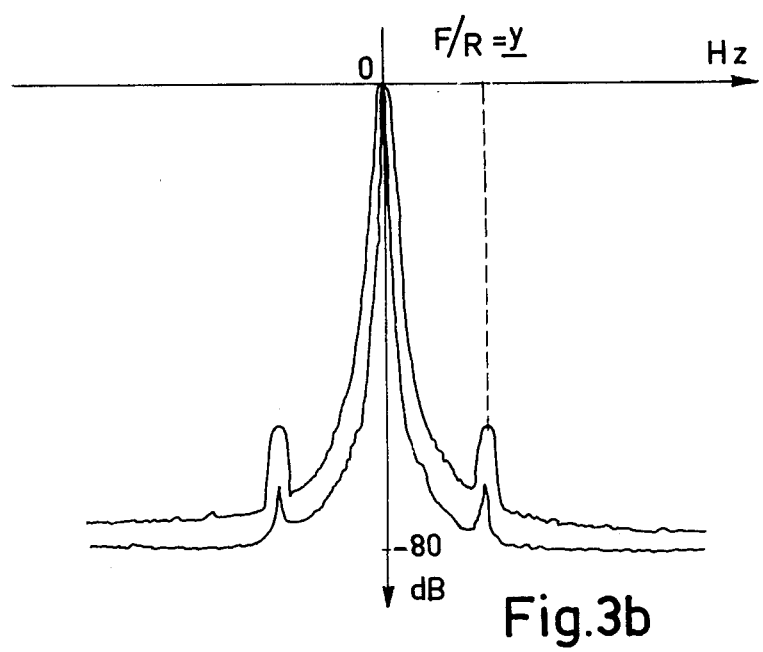
Figure 3C:
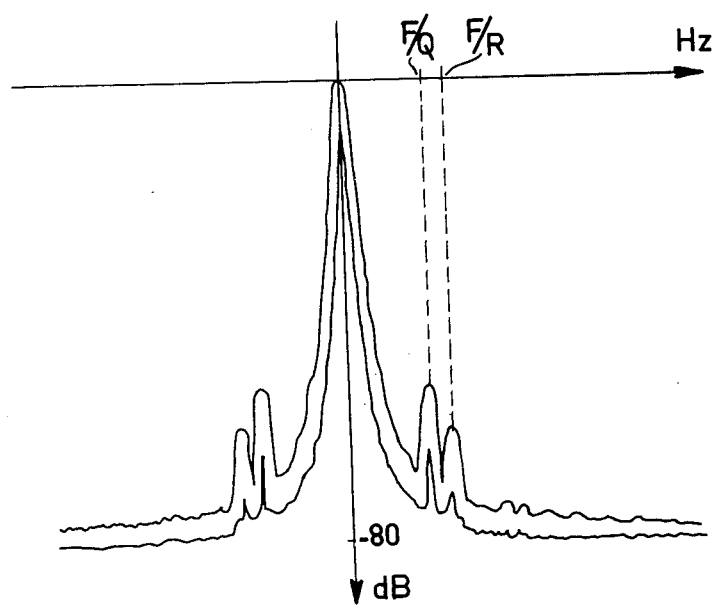

Assuming the counter 26 to be a modulo-10 counter the result of these four different modes of operation not showing considerable differences in a first approximation. For, for example, the first-mentioned adjustment, the result of the division by 10 or by 11 performed by the first divider 2 can be written down and the various possible basic configuration for a period on the basis of the operation described above are:

|     | 10 | 11 | 11 | 11 | 11 | 11 | 11 | 10 | 10 ← 10 | divided by | 10 → 10 | 10 | 10 | 10 |
|-----|----|----|----|----|----|----|----|----|---------|------------|---------|----|----|----|
| or: | 10 | 11 | 11 | 11 | 11 | 11 | 11 | 11 | 10 ← 10 | divided by | 10 → 10 | 10 | 10 | 10 |
| or: | 11 | 11 | 11 | 11 | 11 | 11 | 11 | 10 | 10 ← 10 | divided by | 10 → 10 | 10 | 10 | 10 |
| or: | 11 | 11 | 11 | 11 | 11 | 11 | 11 | 11 | 10 ← 10 | divided by | 10 → 10 | 10 | 10 | 10 | and the counter 36, to be a modulo-8 counter, FIG. 3a shows the spectrum for r=0 and w≠0. FIG. 3b shows such a spectrum for r≠0 and w=0. FIG. 3c (r≠0 and w≠0 which is the most common case) it appears that during the generation of a frequency equal to any multiple of 25 kHz located between 200 and 400 MHz only two spectrum components occur, namely one at 100 kHz and the other one at 125 kHz, the amplitudes of these signal components predominantly depend on the respective values of r and w. Not one single component is demonstrable at 25 kHz. A signal of 25 kHz can only come into existence by intermodulation between the two signals of 100 and 125 kHz and, should this occur, this is due to a non-linearity of the phase comparator 4. However, the 25 kHz signal has then such a week amplitude that it is drowned in the natural noise of the phase comparator 4 and a particularly fine analysing technique would be required to detect it. Consequently, in this embodiment the filter 5 need only suppress the signals at 100 and 125 kHz. Such a filter can be easily realised by means of several Zobel-cells and a low-pass filter cell. At 3 dB the cut-off frequency $f_{cf}$ can then be in the order of magnitude of 60 kHz. This embodiment enables a modulation with a basic rate of 16 k bits/s without distortion. For this modulation the frequency swing ΔF''' around the generated carrier frequency at the output of the oscillator 1 is given by the known formula:

$$\Delta F''' = N\Delta F^4,$$

wherein $\Delta F^4$ is the frequency swing of the modulation introduced at the refeence frequency.

If a constant frequency swing ΔF''' is desired for the different values of F, it is known to add an additional digital loop (not shown) to the synthesizer shown in FIG. 1, which loop automatically acts on the swing $\Delta F^4$ depending on the value of N.

For a proper understanding of the internal operation of the synthesizer according to the invention, the time distribution of the pulses for the control of the division factor adjustment n+1 on the conductor 25 can be analyzed on the basis of the value of the frequency to be generated.

If it is, for example, desired to generate the frequency 236.745 MHz where Q=10 and R=8 or Q=8 and R=10. The result obtained is: M=23, u=6, w=4 or 3, r=3 or 4. It should be noted that to obtain the same frequency value it is alternatively possible by means of the following adjustment with Q=10 and R=8 or with W=8 and R=10 to obtain M=23, u=5, w=9 or 7, r=7 or 9, the respective spectra of FIG. 3c which are that is, more generally: one division by n, thereafter u divisions by n+1, thereafter M−U−1 divisions by n, or: one division by n, thereafter u+1 divisions by n+1, thereafter M−u−2 divisions by n.

Or: u+1 by n+1 thereafter M−u−1 divisions by n.

Or: u+2 divisions by n+1, thereafter M−u−2 divisions by n.

During the operation, these periods follow one another in such a manner that a configuration of divisions by division factor n or n+1 occurs (by 10 or by 11), the repetition period of which extends over a number of E periods, which number E is equal to 40 in the preferred embodiment using an elementary step of 25 kHz. The frequency which corresponds to a period of E periods is in that case equal to that of the elementary stage, so 1/40 MHz=25 kHz. An extra element occurs in the definition of the consecutive identical configuration of E periods, namely the interlocking of the counters 26 and 36. It is, namely, apparent that, for example for moduli of 8 and 10 of Q and R, the parity of the number separating the initial counting position of the counters 26 and 36, respectively, during operation affect the forty-fold configuration. This last element, as well as the possible inversion between Q and R and several possible adjustments for a frequency to be generated, result therefore for the same frequency to be generated in a given number of possible configurations of periods, which are all obtained starting from the four possible basic periods described above, it not being possible to detect an intrinsic signal at F/E=25 kHz at the conductor 7 which is connected to the first input of the phase comparator 4.

In accordance with a preferred embodiment for forming an elementary frequency step of 12.5 kHz in a synthesizer shown in FIG. 2, comprising a reference signal at frequency F=1 MHz, a divider having a division factor M, wherein M is adjustable between 20 and 40, and a first divider having an adjustable division factor 10 or 11, the counters 26 and 36 are modulo-16 counters (no frequency of 62.5 kHz) and modulo-10 counters (no frequency of 100 kHz), reference numeral 26 either indicating a modulo-16 counter, reference numeral 36 then indicating a modulo-10 counter, or counter 26 being a modulo-10 counter, the counter 36 then being a modulo-16 counter. For a line of argument which is analogous to the preceding discussion as regards the distribution of the pulses for the control of the division factor adjustment 11 on the conductor 25, it should be noted that the spurious interferences, present on the output signal of the phase comparator 4 during operation, are limited to spurious components at frequencies of 62.5 kHz and 100 kHz, respectively, and at frequencies which are multiples of these two components. In this case the component of 12.5 kHz (E being equal to the lowest common factor of the numbers Q and R, for example 80) as well as the component of 37.5 kHz which occurs in response to the intermodulation occurring in the phase comparator 4 between the spurious components of 100 kHz and 62.5 kHz, have a negligible amplitude. In such a synthesizer with an elementary step of 12.5 kHz, the spurious signal having the lowest frequency to be attenuated by the filter 5 is 62.5 kHz. This enables a distortion-free modulation of the reference frequency which has a fundamental frequency in the order of magnitude of 16 K bits/s (frequency of the clock generator), which has the additional advantage over the known technique that, since the natural cut-off frequency of the main loop $F_{cb}$ is higher, the response of this main loop is considerably more rapid. It should be noted that an elementary step of 12.5 kHz can be obtained in accordance with the invention by allotting the values 16 and 20 to the pair of Q and R, this embodiment being less advantageous than the preceding one.

Figure 4:
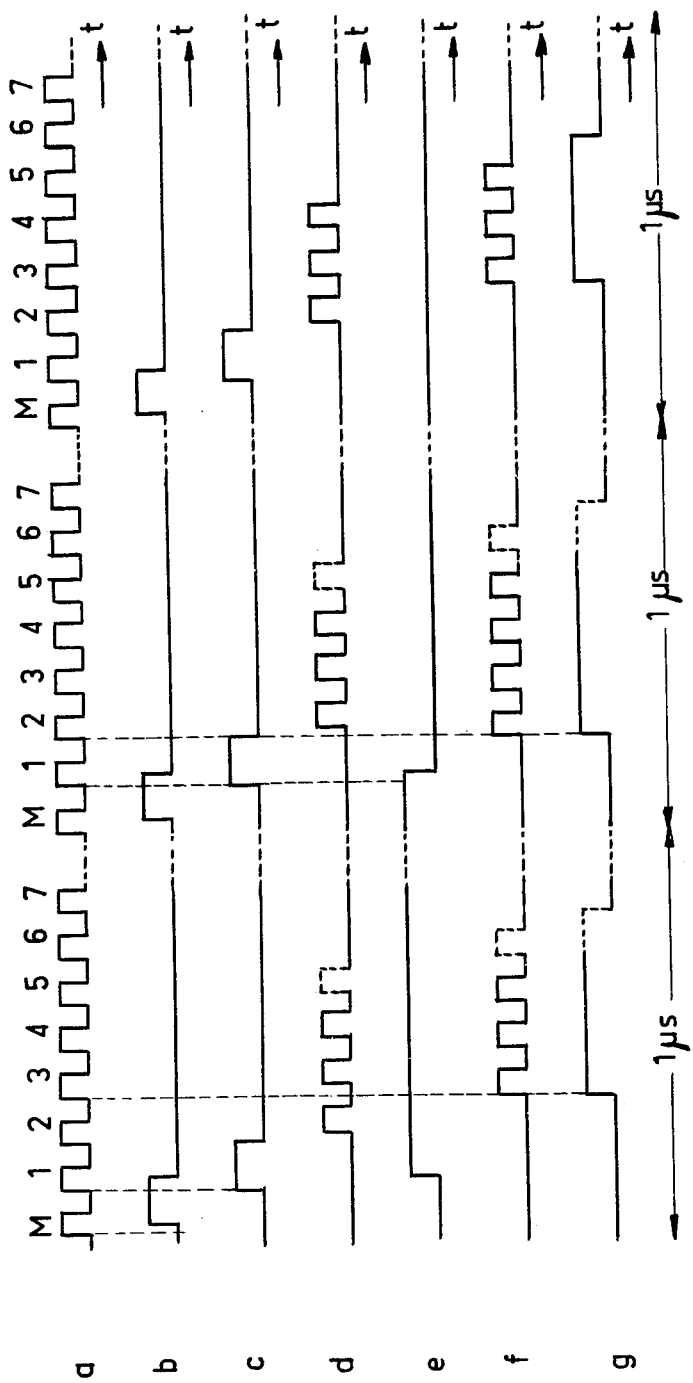
FIG. 4 is a time diagram explaining the distribution of the pulses for controlling the division factor adjustment n+1 in the first divider, the division factor of which is adjustable to the value n or n+1.

The operation of the adder 18 and of the synchronizing devices 19 and 20 can be explained by means of the time diagram of FIG. 4, and also the synchronisation between the signals on the conductors 31, 32 and 22, which synchronisation has been obtained by means of pulse signals on the conductors 24 and 30, these signals being used as clock pulse signals.

FIG. 4a represents the signal on the conductors 22, 24 and 33, this signal being the output signal of the first divider 2 having division factor adjustment n or n+1. Three periods, having a duration of 1/F, are shown and only the 7 first pulses of each periods, preceded by the last pulse of the preceding cycle having the serial number M. In FIG. 4a the dashed line portions are a symbolic representation for each period of M−8 pulses, which are not shown. The dashed-line portions shown at b, c, d, e, f and g in FIG. 4, which correspond to the dashed lines in FIG. 4a, are a symbolic representation of the same duration during which the signal keeps the same level (pre-dominantly the low level, except at e, first period). FIG. 4b shows the signal on the conductor 7, which signal no longer has the same phase as the pulses shown at 4a, due to the propagation time. FIG. 4c shows the output signal of the second synchronizing element 20, this signal being used for resetting the divider 3 and the counter 16 to zero, for counting in the counters 26, 36 and for controlling the adder 18 (conductor 30). Under the control of the signal on the conductor 33 (4a), the input signal of the second synchronizing device 20 is synchronized in the form of a square-wave voltage, the duration of which is equal to a period of the pulses of 4a. FIG. 4d shows the signal on the conductor 32 in the form of a sequence of pulses for the case in which u is equal to, for example, 3. The pulses shown by means of dashed lines, at the end of the first and the second sequences of 4d, indicate that r is at least equal to 2. The pulses shown in 4d and the square-wave voltages of the same duration as the sequence of pulses, respectively, do not have the same phase as the pulse of 4a. FIG. 4e represents the signal on the conductor 31 in the form of a square-wave voltage having a duration of 1 μs (one period) for the case in which w=1, the signal not having the same phase as the pulses of 4a. FIG. 4f shows a signal occurring in the first synchronizing element 19 and corresponding with the signal shown in 4d, after having passed the adder 18 and the synchronizing element 19. It should be noted that the control signal on the conductor 31, which has predominantly a high level during the first of the shown periods does not have any effect in the adder 18 until during the second period of the shown periods and that it appears in the form of a first pulse of the second sequence of pulses of FIG. 4f, this first pulse connecting up with the following pulses which have been formed for the setting u. The presence of this first pulse at the output of adder 18 is caused by the simultaneous presence, at the beginning of the preceding clock pulse period (FIG. 4a, first pulse of the second period), of two high voltage signals on the conductors 30 and 31 at the input of the adder 18 (FIG. 4c and FIG.4e). It should be noted that, to enable the above described operation, there must be a difference of one clock period between each pulse of FIG. 4c and the first pulse of each sequence of FIG. 4f generated for the steps of u MHz. FIG. 4g shows the signal on the conductor 25 which is equivalent to the signal shown in FIG. 4f, each sequence of pulses having been converted into a square-wave voltage of an equal duration. In practice the adders 18 and the first synchronizing element 19 preferably consist of two pairs of D-flip-flops (not shown) which receive the control signal via the conductor 31 and the conductor 32, respectively. The outputs of these two pairs of D-flip-flops are connected to an adding device, the output of which is connected to the conductor 25. Likewise, the second synchronizing element 20 preferably consists of D-flip-flops. From FIGS. 4f and 4g it appears that the pulses formed for the adjusting frequency steps w (shown by means of dashed lines) are relatively shifted over a period of time which is accurately equal to that of a period or a period of time which is equal to a multiple of that period. The pulses formed for the adjusting frequency steps r are also mutually shifted over a period of time which is accurately identical to that of a period or a period of time equal to a multiple of that period. Thus it is achieved, taking the periodicity defined by R and Q into consideration, that when a control pulse for the division factor setting n+1 must occur in response to the adjusted binary numerical value r and w, respectively, there is no risk of this control pulse coinciding fully or partly with the occurrence of a control pulse for controlling the division factor setting n+1 occurring in response to the adjusted binary numerical value u. For the preferred embodiment of the invention explained with reference to FIG. 4, this results in the considerable advantage that the spurious component at the frequency F/E at the output of the phase comparator 4 has such a low amplitude that no filtration is required. This not only results in a shorter speed of response of the control loop, but also in that the frequency synthesizer is suitable to be modulated with a high fundamental frequency of, for example, 16 K bits/sec at any carrier frequency located between 200 and 400 MHz, for example, at one out of 8000 channel frequencies having a mutual channel frequency spacing of 25 kHz.

So far this description has only dealt with a first divider 2 having a division factor setting n or n+1, dividing the number of pulses it receives by 10 or by 11. It should be noted that other values of n can be chosen by changing the value of F, the remaining portion of the synthesizer remaining predominantly unchanged. The same results are namely obtained at the output of the oscillator 1 for the above-described embodiment of the invention by simultaneously choosing a value for n which is, for example, twice as small and a reference having a value of 2 F. It is, for example, possible to replace n=10, F=1 MHz, without detracting from the above description, as regards the synthesis of small steps (u, r and w), but by performing a division, not shown in the drawing, by a division factor 2, just before the counting inputs of the second and third counters 26 and 36 and the input for resetting the first counter 16 to zero, and to choose a division factor adjustment for the first divider 2 equal to, for example, n=5 (first divider 2 adjustable to 5 or 6) and F=2 MHz in the circuit of FIG. 2. By means of such embodiments of the invention it is possible to change the value of N and to change thereafter, in inverse proportion, the value of $F_{cb}$ in accordance with the abovementioned formula 1, should this be required.

In the preceding the setting of the frequency to be generated is done by manual operation of the double-throw switches such as 6, 29, 40, 42 or of the tenposition switches which preceed these double-throw switches and which convert a decimal setting in known manner into a corresponding binary setting for said double-throw switches, different settings being possible for specific values of the frequencies to be generated. The preferred embodiment of a frequency synthesizer according to the invention, the embodiment of which the elementary step is 25 kHz as well as the embodiment of which the elementary step is 2.5 kHz, comprises, however, code-translating elements as shown in FIG. 5.

Figure 5:
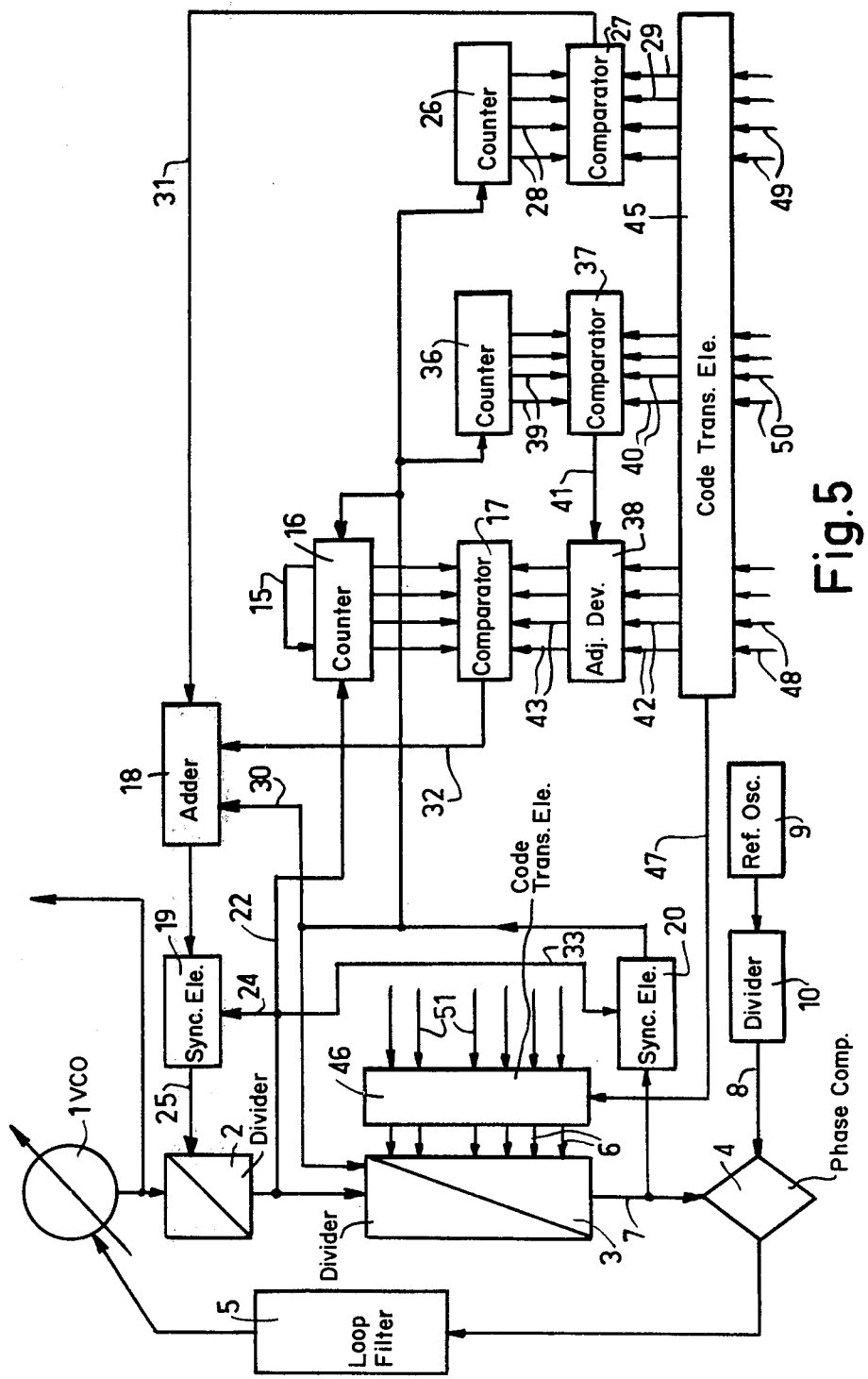
FIG. 5 is a simplified block diagram of a preferred embodiment of the frequency synthesizer according to the invention.

Elements in FIG. 5 which have the same construction and the same function as those in FIG. 2 are given the same reference numerals and, for simplicity, the frequency searching loop, which is identical to the loop shown in the FIGS. 1 and 2, is not shown in FIG. 5. In addition to the identical elements, the synthesizer shown in FIG. 5 comprises two code translating elements 45 and 46. Except for one, all outputs minus one of the code-translating element 45 are connected to the switches 29, 40, 42 while an output conductor 47 is connected to the code translating device 46. The switches 48, 49, 50 of the code translating device 45 enable the setting of the megahertz units, the hundreds of kilohertz and the number of elementary steps of 25 kHz or 12.5 kHz, respectively, as expressed by the number which is representative of the frequency to be generated which is described on a decimal basis, each decimal figure so obtained previously having been converted into a binary value, either after computation, or automatically, all this in known manner, from three coding devices, not shown in the Figure, which are provided just before the switches 48 and 49, 50 respectively. Similarly, the code translating element 46 is connected to the switches 6 and receives, in addition to the signal on the conductor 47, the signals of the switches 51 which represent by means of a binary value the number of tens of megahertz determined by the two first decimal figures from the left-hand side onwards in the representative number of the frequency to be generated, which is represented in decimal notation. The switches 51 may also be the outputs of two coding devices, not shown in the Figure. It should be noted that, according to the invention, two switches 50 are sufficient for an elementary step of 25 kHz, whereas 4 switches are necessary for an elementary step of 12.5 kHz (on the assumption that Q=10). The code translating devices 45 and 46 serve to convert any frequency setting, which is within the capability of the oscillator 1, in steps of 100 MHz, 10 MHz, 1 MHz, 100 kHz, 25 kHz and 12.5 kHz, respectively, into steps of 100 MHz, 10 MHz, 1 MHz, 100 kHz, 125 kHz and 62.5 kHz, respectively, indicating the same frequency value.

For an elementary step of 25 kHz the logic processing operation realised by the code translating device 45 is preferably as follows: for a setting of d elementary steps of 25 kHz and e steps of 100 kHz, it is necessary to adjust d steps of 125 kHz and e - d steps of 100 kHz. For a negative value e−d the settings required are 10+e−d steps of 100 kHz and one less for the 1 MHz steps, which is a known residual value processing operation. Depending on the frequency to be generated, this residual value in the form of, for example, a logic voltage level can be transferred from the code translating device 45 to the code translating device 46 via the conductor 47 in order to effect the setting of the hundreds of megahertz in this code translating device 46. In order to realise these simple logic functions the elements 45 and 46 comprise, for example, read-only memories and/or binary adding devices.

Let it be assumed that, for example, the frequency of 31.775 MHz (Q=10, R=8) must be generated. By means of the conductors 50, 49, 48, 51 the FIGS. 3, 7, 1 and 32, respectively, are set. After code translation by means of the elements 45 and 46, the figures which are translated by the switches 40, 29, 42 and 6 become: 3, 4, 1, 32, respectively. Likewise, the setting of the input of 3, 0, 0, 30 for the frequency 300.075 MHz corresponds to a setting of the output: 3, 7, 9, 29.

For the embodiment of a synthesizer according to the invention with an elementary step of 12.5 kHz, the logic processing operation realized by means of the code translating device 45 is, for example, as follows, it being assumed that Q=10, R=16; for an elementary step of 12.5 kHz which is set at 50, the number e (10+e) respectively, reduced by 3 must be set at 29 and 5 at 40 (5×62.5=312.5).

For 2×12.5 kHz, adjust e−1 and 2 (2×62.5=125).
For 3×12.5 kHz, adjust e−4 and 7 (7×62.5=437.5).
For 4×12.5 kHz, adjust e−2 and 4 (4×62.5=250).
For 5×12.5 kHz, adjust e and 1 (1×62.5=62.5).
For 6×12.5 kHz, adjust e−3 and 6 (6×62.5=375).
For 7×12.5 kHz, adjust e−1 and 3 (3×62.5=187.5)
For 0×12.5 khz, adjust e and 0 (0×62.5=0).

For this code translation any carry and change of setting resulting therefrom for the higher tens is transferred in the same manner as described for the preceding case.

The code translations described above can be directly transposed in the case that, in the one situation Q=8, R=10, in the other situation Q=16, R=10.

The invention is in no way limited to the use of the decimal number system. It is, namely, possible to use this invention also on the basis of a different numerical system.

It appears for all the embodiments of the invention described above that the maximum permissible modulation rhythm is no longer limited by the value of the cutoff frequency $F_{cf}$ of the low-pass filter included in the phase-locked loop, but only by the value of the natural response of the loop $F_{cb}$ in the absence of the filter. Depending on whether it is possible to increase the frequency $F_{cf}$ it is, alternatively, possible to increase the frequency $F_{cb}$ by acting on the values of the parameters of the loop (see the above formula 1) and especially by increasing the value of G. As described above such an increase of $F_{cb}$ is only limited by the fact that $F_{cb}$ must not approach $F_{cf}$ too closely and that $F_{cb}$ must remain below $F_{cf}$, so that the stability criteria of the main loop are satisfied.

Another embodiment of the invention, which is not shown, uses the technique of the decimal-fraction principle by acting simultaneously on the control of the first divider 2 with a division factor setting between n/n+1 and on the setting of the second divider 3. In this case the first digital loop for forming the frequency steps f (1 MHz) is omitted from the synthesizer shown in FIG. 2, the conductor 41 being directly connected to the conductor 32. On the other hand, there is provided, between the conductors 6 and the second divider 3, an adjusting adding device which forms part of a digital loop arranged in cascade between the conductor 7 and the second divider 3 and comprising a modulo-10 counter, a comparator, on which the desired number u has been set, and said adding device 18 which adds the value u to the value M it receives from the conductors 6 in order to control in the second divider 3 a recurring sequence of divisions having a duration 10/F (10 periods) which comprise u consecutive divisions by division factor M+1, followed by 10−u divisions.

What is claimed is:

1. A frequency synthesizer comprising a phase-locked loop having, in this order, at least a voltage-controlled oscillator (VCO), a first divider with an adjustable division factor n or n+1, n being an integer, a second divider the division factor of which is a programmable integer M, a phase comparator and a low-pass filter, the output signal of this second divider and a reference signal having a frequency F being applied to said phase comparator for generating an output signal which is applied as control voltage to the voltage-controlled oscillator via the low-pass filter, the frequency synthesizer further comprising a first digital loop having a first pulse counter, for counting the input pulses of the said second divider and being restarted from its initial counting position by each output pulse of the second divider, and a first comparison device to which the counting position of said first counter and a digital numerical value u, which is adjustable by means of a first adjusting device, are applied for generating a control signal for controlling said first divider so that the size of the frequency steps is equal to the reference frequency F, as well as a second digital loop having a second pulse counter, counting the output pulses of the said second divider, and a second comparison device to which the counting position of the said second pulse counter and a digital numerical value, which is adjustable by means of a second adjusting device, are applied for generating a control signal for controlling said first divider so that the size of the frequency steps is equal to z, z being of such a value that F is a multiple thereof to obtain a division into decimal steps, characterized in that the frequency synthesizer further comprises a third digital loop for generating frequency steps having a size equal to y, y being of such a value that F is a multiple thereof, this third digital loop comprising a third pulse counter (modulo-F/y) for counting the output pulses of said second divider, and a third comparison device which compares the counting position a of the said third counter with a digital numerical value r, which is adjustable by means of a third adjusting device, for generating an output signal which increases the numerical value u in said first adjusting device by one unit for each time the position a is smaller than or equal to the numerical value r.

2. A frequency synthesizer as claimed in claim 1, characterized in that the output of said first comparator and the output of said second comparator are coupled to the control input of said first divider via a first synchronizing element, that the output of the said second divider is coupled via a second synchronizing element to the input of the said second counter and to the input of the said third counter, and that said first and second synchronizing elements are controlled by the output pulses of the said first divider, the control pulses for controlling the division factor adjustment n+1, occurring during the generation of the frequency steps having the value z, and the control pulses for controlling the division factor setting n+1, occurring during the generation of the frequency steps y, respectively, have a fixed configuration of appearance in time and the time interval between the beginning of two consecutive pulses of a configuration being equal to 1/F or a multiple of this time interval.

3. A frequency synthesizer as claimed in claim 1, wherein F is equal to 1 MHz, and wherein one of the values y and z is equal to 100 kHz while the other of the values y and z is equal to 125 kHz.

4. A frequency synthesizer as claimed in claim 3, characterized in that it comprises a code translating element for automatically switching from an adjustment in steps of 100 MHz, 10 MHz, 1 MHz, 100 kHz, and 25 kHz to an adjustment in steps of 100 MHz, 10 MHz, 1 MHz, 100 kHz and 125 kHz, indicating the same frequency value.

5. A frequency synthesizer as claimed in one of the claims 3 or 4, wherein a reference frequency is frequency-modulated, characterized in that the rate of the modulation may be higher than 16 k bits/s at the output frequency, which is the output frequency of said VCO, without distorting the modulation.

6. A frequency synthesizer as claimed in claim 1, wherein F is equal to 1 MHz, and wherein one of the values y and z is equal to 100 kHz while the other of the values y and z is equal to 62.5 kHz.

7. A frequency synthesizer as claimed in claim 6, characterized in that it further comprises a code translating element for automatically switching from an adjustment in steps of 100 MHz, 10 MHz, 1 MHz, 100 kHz and 12.5 kHz of an adjustment in steps of 100 MHz, 10 MHz, 1 MHz, 100 kHz and 62.5 kHz, indicating the same frequency value.

8. A frequency synthesizer as claimed in claim 6 or claim 7, wherein the said reference frequency is frequency-modulated, characterized in that the rate of the modulation can reach 16 k bits/s at the output frequency, which is the output frequency of the VCO, without distorting the modulation.

9. A frequency synthesizer as claimed in one of the claims 1 to 4, inclusive, wherein the first divider is formed by a modulo-5/6 counter, F being equal to 2 MHz, characterized in that the synthesizer further comprises a frequency divider having a division factor of 2, which is provided before the counting inputs of the second counter and the third counter and the input for restarting the first counter.

10. A frequency synthesizer as claimed in claim 8, characterized in that the synthesizer comprises a digital loop which automatically controls the frequency swing of the modulation performed on the reference frequency, depending on the value of the overall division ratio of the main loop, in such a manner that the frequency swing in response to the modulation remains substantially constant at the output of the oscillator for the overall range of the frequencies to be generated.

* * * * *